(12) United States Patent
Tan et al.

(10) Patent No.: US 11,476,168 B2
(45) Date of Patent: Oct. 18, 2022

(54) DIE STACK OVERRIDE FOR DIE TESTING

(71) Applicant: Intel Corporation, Santa Clara, CA (US)

(72) Inventors: Terrence Huat Hin Tan, Georgetown (MY); Rehan Sheikh, Austin, TX (US); Michael T. Klinglesmith, Portland, OR (US); Sukhbinder Takhar, Portland, OR (US); Shi Hou Chong, Penang (MY); Kok Hin Oon, Bayan Lepas (MY); Wai Loon Yip, Penang (MY); Yudhishthira Kundu, Bangalore (IN); Deepak R. Tanna, Doddennakundi Village (IN)

(73) Assignee: Intel Corporation, Santa Clara, CA (US)

( * ) Notice: Subject to any disclaimer, the term of this patent is extended or adjusted under 35 U.S.C. 154(b) by 1038 days.

(21) Appl. No.: 15/948,851

(22) Filed: Apr. 9, 2018

(65) Prior Publication Data

US 2019/0311960 A1 Oct. 10, 2019

(51) Int. Cl.
*H01L 21/66* (2006.01)
*H01L 25/065* (2006.01)
*H01L 23/498* (2006.01)
*G01R 31/28* (2006.01)

(52) U.S. Cl.
CPC .......... *H01L 22/34* (2013.01); *G01R 31/2851* (2013.01); *H01L 23/49816* (2013.01); *H01L 25/0652* (2013.01); *H01L 2225/0652* (2013.01); *H01L 2225/06513* (2013.01); *H01L 2225/06517* (2013.01)

(58) Field of Classification Search
CPC ......... H01L 22/00; H01L 24/00; H01L 25/00; G01R 1/00; H05K 3/00
See application file for complete search history.

(56) References Cited

U.S. PATENT DOCUMENTS

| 2,697,936 | A | * | 12/1954 | Farrow | G01N 29/07 73/644 |
| 9,041,409 | B1 | * | 5/2015 | Look | G01R 31/54 324/522 |
| 2013/0120021 | A1 | * | 5/2013 | Chi | G11C 29/886 257/777 |
| 2014/0300379 | A1 | * | 10/2014 | Ryckaert | H01L 22/34 324/754.03 |
| 2017/0110407 | A1 | * | 4/2017 | Chaware | H01L 25/0655 |
| 2018/0158749 | A1 | * | 6/2018 | Yu | H01L 23/3675 |

* cited by examiner

*Primary Examiner* — Jermele M Hollington
*Assistant Examiner* — Temilade S Rhodes-Vivour
(74) *Attorney, Agent, or Firm* — Akona IP PC

(57) ABSTRACT

Disclosed herein are structures and techniques for exposing circuitry in die testing. For example, in some embodiments, an integrated circuit (IC) die may include: first conductive contacts at a first face of the die; second conductive contacts at a second face of the die; die stack emulation circuitry; other circuitry; and a switch coupled to the second conductive contacts, the die stack emulation circuitry, and the other circuitry, wherein the switch is to couple the second conductive contacts to the other circuitry when the switch is in a first state, and the switch is to couple the die stack emulation circuitry to the other circuitry when the switch is in a second state different from the first state.

23 Claims, 4 Drawing Sheets

DIE STACK OVERRIDE FOR DIE TESTING

BACKGROUND

Integrated circuit (IC) dies may be tested as a part of the manufacturing process. Such tests may include mechanical tests and circuitry performance tests.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
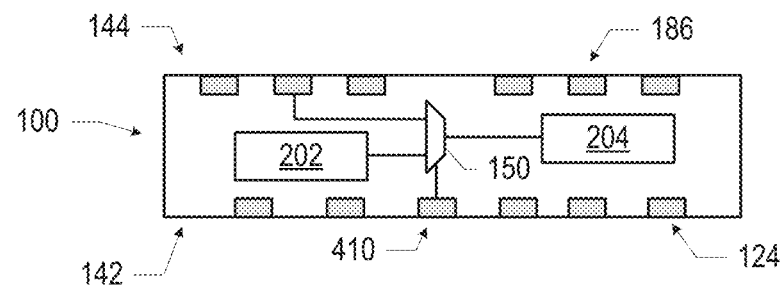
FIG. 1 is a side, cross-sectional view of a die including a die stack override switch, in accordance with various embodiments.

Disclosed herein are structures and techniques for exposing circuitry in die testing. For example, in some embodiments, an integrated circuit (IC) die may include: first conductive contacts at a first face of the die; second conductive contacts at a second face of the die; die stack emulation circuitry; other circuitry; and a switch coupled to the second conductive contacts, the die stack emulation circuitry, and the other circuitry, wherein the switch is to couple the second conductive contacts to the other circuitry when the switch is in a first state, and the switch is to couple the die stack emulation circuitry to the other circuitry when the switch is in a second state different from the first state.

Some IC structures, such as IC packages, may include multiple dies stacked on top of one another. Because the dies in a die stack communicate with each other, testing the performance of a particular die in a die stack has conventionally required that the whole stack be fabricated and assembled before testing can begin. This, however, may limit how quickly a die stack can move from development into a final product; since different ones of the dies in a stack may require different development times, conventional testing approaches have required that testing be delayed until all dies are ready for test.

Disclosed herein are structures and techniques that allow individual testing of dies that are to be included in a die stack before the other dies in the die stack are themselves ready for testing. These structures and techniques may accelerate the product development process by allowing dies (as well as package substrates and other components) that are ready for testing to be promptly tested, without having to wait for other dies in the stack. Further, because some dies may be tested and refined before others, the testing of the die stack once all dies are completed may be simplified and/or may proceed more quickly. The structures and techniques disclosed herein may further enable the use of die stacks in new electronic devices by improving the manufacturing, assembly, and testing processes. These structures and techniques may be particularly advantageous when used to test dies that are "lower" in a die stack and less complex before dies that are "higher" in a die stack and more complex, when used to test a die stack with mixed silicon technology, or when used to test dies that are likely to be included in IC assemblies with different other dies in different products.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, a "die" and an "IC die" are synonymous. When used to describe a range of dimensions, the phrase "between X and Y" represents a range that includes X and Y.

FIG. 1 is a side, cross-sectional view of a die 100 having a first face 142 and an opposing second face 144. Conductive contacts 124 may be disposed at the first face 142, and conductive contacts 186 may be disposed at the second face 144. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket). The die 100 may have conductive pathways between the first face 142 and the second face 144, or between different locations on the first face 142, and/or between different locations on the second face 144. These conductive pathways may take the form of any of the interconnects 1628 discussed below with reference to FIG. 6. In some embodiments, the pitch and/or the size of the conductive contacts 124 may be different than the pitch and/or size, respectively, of the conductive contacts 186. For example, in some embodiments, the conductive contacts 124 may interface with first-level interconnects to electrically couple the conductive contacts 124 to conductive contacts of a package substrate, and the conductive contacts 186 may interface with die-to-die interconnects to electrically couple the conductive contacts 186 to another die (e.g., as discussed below with reference to FIGS. 2 and 3). In some other embodiments, the conductive contacts 124 may interface with a first set of die-to-die interconnects to electrically couple the conductive contacts 124 to conductive contacts of another die, and the conductive contacts 186 may interface with die-to-die interconnects to electrically couple the conductive contacts 186 to a different die (e.g., when the die 100 is between two other dies in a die stack). The die 100 may be used in other arrangements (e.g., an interposer may be coupled to the conductive contacts 124 or the conductive contacts 186, etc.).

The die 100 may include multiple sets of circuitry. For example, FIG. 1 illustrates an embodiment in which the die 100 includes die stack emulation circuitry 202 and other circuitry 204. A die stack override switch 150 may be coupled between the die stack emulation circuitry 202 and the other circuitry 204. The die stack override switch 150 may also be coupled between some or all of the conductive contacts 186 and the other circuitry 204. As illustrated in FIG. 1 (and others of the accompanying figures), the die stack override switch 150 may take the form of a multiplexer, alternatively coupling the die stack emulation circuitry 202 or the conductive contacts 186 to the other circuitry 204. For ease of illustration, the die stack override switch 150 will be described herein as "selecting" the conductive contacts 186 when the die stack override switch 150 is in a state in which the die stack override switch 150 provides conductive pathways between the other circuitry 204 and some or all of the conductive contacts 186, and the die stack override switch 150 will be described as "selecting" the die stack emulation circuitry 202 when the die stack override switch 150 is in a state in which the die stack override switch 150 provides conductive pathways between the other circuitry 204 and the die stack emulation circuitry 202. In some embodiments, the signaling provided through the die stack override switch 150 (e.g., from the conductive contacts or the die stack emulation circuitry 202) may be Fabric Device Management Interface (FDMI) signals. In some embodiments, the other circuitry 204 may include signal circuitry, which may perform signal processing, communications, computing, or other operations.

The state of the die stack override switch 150 may be controlled by electrical signals provided to a die stack override contact 410, which may be one of the conductive contacts 124 at the first face 142 of the die 100. The die 100 may include a conductive pathway between the die stack override contact 410 and the die stack override switch 150 such that electrical signals provided to the die stack override contact 410 may change the state of the die stack override switch 150. Note that, when the die stack override switch 150 selects the conductive contacts 186, the die stack emulation circuitry 202 may be electrically coupled to the other circuitry 204 through other conductive pathways (not shown).

Any suitable circuit architecture may provide the die stack override switch 150. For example, any suitable multiplexer circuitry may be used to provide the die stack override switch 150. Although a single die stack override switch 150 is depicted in FIG. 1 (and others of the accompanying figures), and the singular term "die stack override switch 150" is used herein, this is simply for ease of discussion, and a die 100 may include multiple die stack override switches 150 arranged appropriately so that the die stack override switches 150 may be controlled to alternatively couple the die stack emulation circuitry 202 and the conductive contacts 186 to the other circuitry 204. In some embodiments, the die stack override switches 150 may be provided by a dedicated mesh of switches. In some embodiments, a single die stack override contact 410 may be in electrical contact with multiple die stack override switches 150 to cause the multiple die stack override switches 150 to select different ones of their inputs.

The die 100 may be designed so as to typically operate in a die stack, with another die coupled to the conductive contacts 186 at the second face 144 (e.g., as discussed below with reference to FIG. 3); in such typical operation, the die stack override switch 150 may be controlled to select the conductive contacts 186, and the other circuitry 204 and the other die may communicate via these conductive contacts 186. When that other die is not present (or a dummy die is used to stand in for that other die, as discussed below with reference to FIG. 2), the die stack override switch 150 may be controlled to select the die stack emulation circuitry 202, "disconnecting" the other circuitry 204 from some or all of the conductive contacts 186. The die stack emulation circuitry 202 may then provide signals to the other circuitry 204 to emulate the presence of one or more other dies in a stack.

In some embodiments, the die stack emulation circuitry 202 may include a processing device and memory included in the die 100. During typical operation of the die 100 (e.g., when the die 100 is included in an IC assembly 500, as discussed below with reference to FIG. 3), this processing device and memory may perform other, non-testing functions. For example, the die stack emulation circuitry 202 may include a microcontroller and associated static random access memory (SRAM) that, during typical operation of the die 100, may act as a security and management engine (e.g., preventing unsecured external access), or may perform other functions. During testing of the die 100, when the die stack override switch 150 selects the die stack emulation circuitry 202, the die stack emulation circuitry 202 may perform testing operations (e.g., upon loading a test program, in contrast to typical operation, in which the die stack emulation circuitry 202 may load a different program). In some embodiments, the die stack emulation circuitry 202 may detect the state of the die stack override switch 150 (or the control signals provided to the die stack override switch 150), and upon detection, may perform testing operations.

In some embodiments, the die stack emulation circuitry 202 may include a test data register that may be accessed and programmed by testing equipment (e.g., the TE 160 discussed below with reference to FIG. 2); testing of the other circuitry 204 may be controlled by values written to the test data register by the testing equipment, as well as other signals provided to the die stack emulation circuitry 202 by the testing equipment.

In some embodiments, the die stack emulation circuitry 202 may perform a test program to test the other circuitry 204. In some embodiments, this test program may be stored in a memory of the die stack emulation circuitry 202, and may be executed when the die stack override switch 150 selects the die stack emulation circuitry 202. In some embodiments, the test program may be provided to the memory of the die stack emulation circuitry 202 via a test access port of the die 100 (e.g., through Joint Test Action Group (JTAG) instructions); this test access port may include one or more of the conductive contacts 124 at the first face 142 of the die 100, and the test program may be provided to the test access port by test equipment (e.g., the test equipment (TE) 160 discussed below with reference to FIG. 2). The test program may include any operations that test the functionality of the other circuitry 204. For example, in some embodiments, the test program may include a data transfer between a memory of the die stack emulation circuitry 202 and input/output circuitry of the other circuitry 204; a successful test may occur when the data transfer results match the expected results.

In some embodiments, the die stack emulation circuitry 202 may execute JTAG instructions to emulate signals from another die (e.g., clock and/or reset signals) to the other circuitry 204. In some embodiments, the die stack emulation circuitry 202 may, as part of a test program, disable protocol handshakes (e.g., power management and/or Direct Media Interface (DMI) handshakes) between the die 100 and another die.

Figure 3:
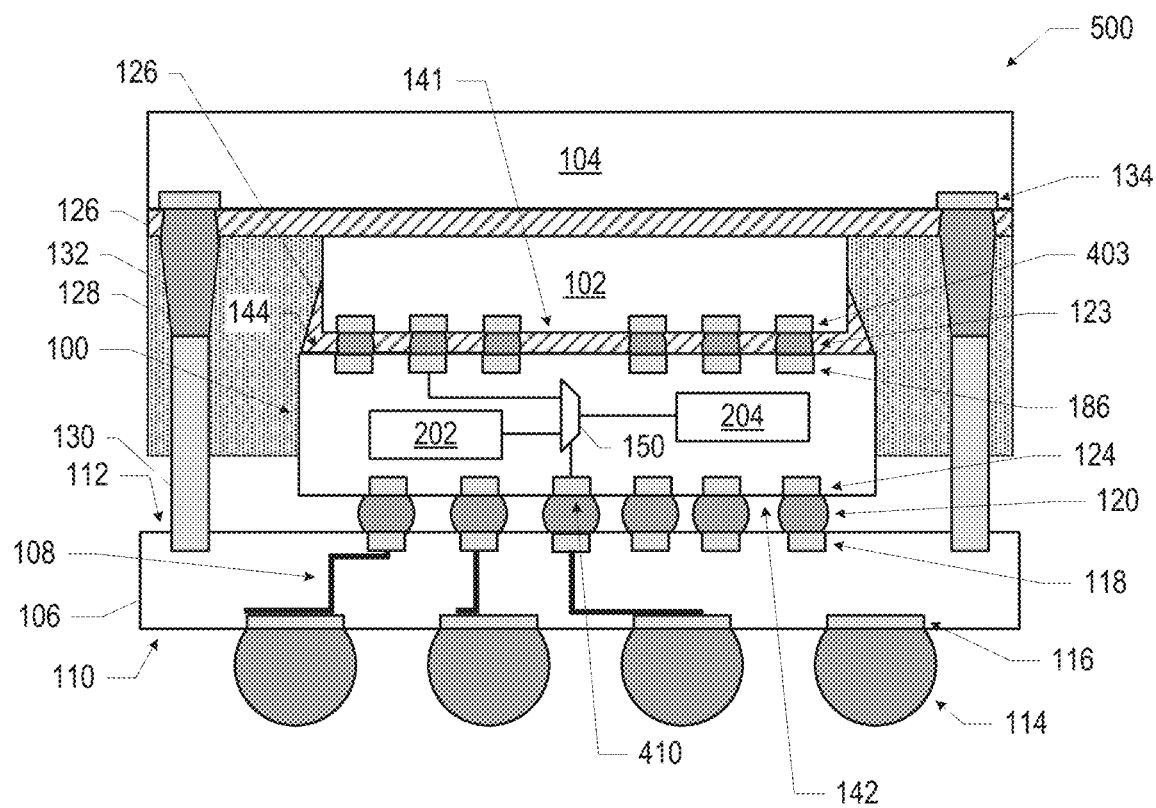
FIG. 3 is a side, cross-sectional view of an integrated circuit (IC) assembly including the die of FIG. 1, in accordance with various embodiments.

As noted above, the die stack override switch 150 may be controlled to select the die stack emulation circuitry 202 during testing of the die 100. In some embodiments, the die 100 may be assembled into a test assembly 300 prior to testing. The test assembly 300 may share many physical features with the "final" product assembly into which the die 100 will be included (e.g., the IC assembly 500 discussed below with reference to FIG. 4). FIG. 3 illustrates an example test assembly 300 including the die 100. In the test assembly 300, the conductive contacts 124 at the first face 142 of the die 100 are coupled to conductive contacts 118 at the second face 112 of the package substrate 106 by first-level interconnects 120. Second-level interconnects 114 may be coupled to conductive contacts 116 at the first face 110 of the package substrate 106. The package substrate 106 may be formed of a dielectric material, and may have conductive pathways 108 extending through the dielectric material between the first face 110 and the second face 112, or between different locations on the first face 110, and/or between different locations on the second face 112. The conductive contacts 118 may be coupled to conductive pathways 108 through the package substrate 106, allowing circuitry within the die 100 to electrically couple to various ones of the conductive contacts 116. The first-level interconnects 120 illustrated in FIG. 3 are solder bumps (e.g., controlled collapse chip connection ("C4") bumps), but any suitable first-level interconnects 120 may be used. The second-level interconnects 114 illustrated in FIG. 3 are solder balls (e.g., for a ball grid array arrangement), but any suitable second-level interconnects 114 may be used (e.g., pins in a pin grid array arrangement or lands in a land grid array arrangement).

In the test assembly 300, the second-level interconnects 114 of the package substrate 106 may be used to couple the test assembly 300 to a TE 160. In particular, the TE 160 may include conductive contacts 158 to which the conductive contacts 116 are electrically coupled via the second-level interconnects 114. During testing, the TE 160 may provide an electrical signal to the die stack override contact 410 of the die 100 (via the package substrate 106) to cause the die stack override switch to select the die stack emulation circuitry 202 (as discussed further below); testing of the die 100 may then proceed under the control of the TE 160, or under the control of a test program stored in the die stack emulation circuitry 202. Further, the TE 160 may provide other signals to support testing. For example, the TE 160 may provide clock signals to the die 100. The TE 160 may provide other functionality, such as a Universal Serial Bus (USB) tester, so that other functionality of the die 100 (e.g., USB Host Controller Interface (HCI) functionality) may be tested without the need for other dies in a die stack.

In some embodiments, the TE 160 may be automated test equipment (ATE) used to test the die 100. For example, the TE 160 may include a circuit board or other set of conductive contacts and signal lines that may communicate with the die 100 in the test assembly 300 to test functionality of the die 100. In some embodiments, the TE 160 may include a system board (e.g., having memory, USB devices, and/or other circuit elements) disposed thereon, and the TE 160 may perform platform-level validation operations including the die 100 (e.g., to test the operation of the die 100 in a platform setting). Thus, the embodiments disclosed herein may provide improvements to ATE functionality and/or to platform-level validation.

Figure 2:
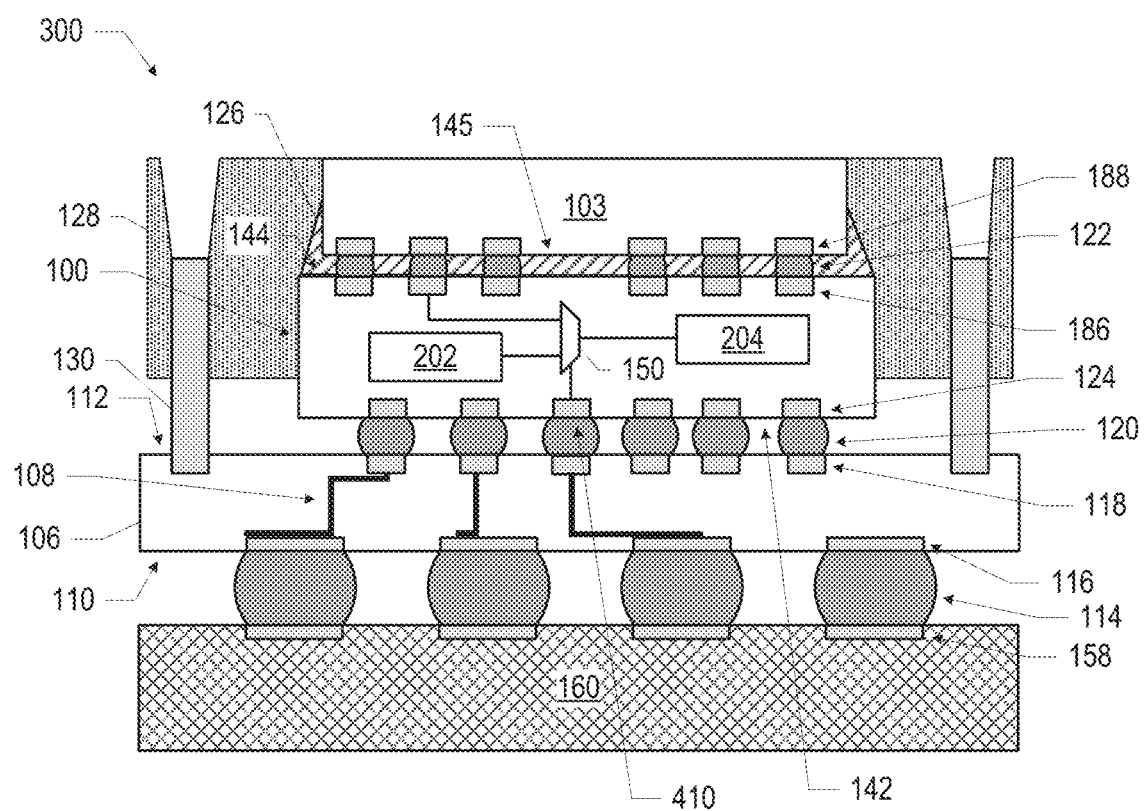
FIG. 2 is a side, cross-sectional view of a test assembly including the die of FIG. 1, in accordance with various embodiments.

A dummy die 103 may be coupled to the second face 144 of the die 100. In particular, conductive contacts 186 at the second face 144 of the die 100 may be electrically coupled to conductive contacts 188 at a first face 145 of the die 102 by die-to-die interconnects 122 (e.g., micro-C4 bumps). The dummy die 103 may not include any active circuitry, but may instead include only a few metal layers (e.g., a "short loop" die). The dummy die 103 may be present in the test assembly 300 in order to mechanically (but not electrically) emulate the presence of another die on "top" of the die 100 in a final product (e.g., the IC assembly 500 discussed below with reference to FIG. 3), and thus may allow the assembly operations involved in the attachment of the dummy die 103 to be tested as well. The die 100 and the dummy die 103 may together provide a test die stack. In some embodiments, an underfill material 126 may be disposed around the first-level interconnects 120 and/or the die-to-die interconnects 122 (the latter is shown in FIG. 2). Example materials that may be used for the underfill material 126 may include epoxy materials.

The package substrate 106 of the test assembly 300 may include conductive pillars 130 (e.g., copper pillars) that may extend from the second face 112. These conductive pillars 130 may be conductive contacts for conductive pathways within the package substrate 106, and in a final product, may be electrically connected to another component (e.g., a die, as illustrated in FIG. 3). Within the test assembly 300, the conductive pillars 130 may not be electrically connected to any other components within the test assembly 300.

The test assembly 300 may also include a mold material 128 that may be disposed around the die 100, the dummy die 103, and the conductive pillars 130. The mold material 128 may include recesses to expose the upper surfaces of the conductive pillars 130, as shown.

During testing of the die 100 in the test assembly 300, the TE 160 may contact the package substrate 106, and may provide an appropriate electrical signal (e.g., a positive or negative voltage of a predetermined magnitude) to the die stack override contact 410 to cause the die stack override switch 150 to select the die stack emulation circuitry 202. The die stack emulation circuitry 202 may provide signals to the other circuitry 204 during testing, emulating the signals that may be provided to the other circuitry 204 by one or more "real" (not dummy) dies coupled to the second face 144 of the die 100 (as discussed above). As noted above, the dummy die 103 may be present for mechanical testing purposes.

As noted above, the die 100 may be included in an IC assembly. For example, FIG. 3 is a side, cross-sectional view of an IC assembly 500 including the die 100 of FIG. 1. The IC assembly 500 may include a package substrate 106; the package substrate 106 of the IC assembly 500 may take the forms of any of the embodiments of the package substrate 106 discussed above with reference to FIG. 2. The second-level interconnects 114 of the package substrate 106 of the IC assembly 500 may be used to couple the IC assembly 500 to another component, such as a circuit board (e.g., a motherboard), an interposer, or another IC assembly, as known in the art and as discussed below with reference to FIG. 7. The die stack override contact 410 at the first face 142 of the die 100 may be electrically coupled to a conductive contact 118 of the package substrate 106. When the die 100 is not being tested, an appropriate electrical signal may be provided to the die stack override contact 410 (e.g., by a circuit board coupled to the package substrate 106) to select the conductive contacts 186.

A die 102 may be coupled to the second face 144 of the die 100. In particular, conductive contacts 186 at the second face 144 of the die 100 may be electrically coupled to conductive contacts 403 at a first face 141 of the die 102 by die-to-die interconnects 123 (e.g., micro-C4 bumps). In some embodiments, an underfill material 126 may be disposed around the die-to-die interconnects 123. The die 100 and the die 102 may together provide a die stack. In some embodiments, the dies 100 and 102 may be arranged "face to face" in that their active regions (discussed below with reference to FIG. 6) may face each other. Although the die stack illustrated in FIG. 3 includes 2 dies, this is simply for ease of illustration, and the die stacks included in an IC assembly 500 (or in a test assembly 300, as discussed above with reference to FIG. 2) may include more than two dies, as desired. In a die stack that includes more than two dies, the die 100 may be any of the dies other than the "top" die; for example, the die 100 may be any die located between two other dies, or between a die and the package substrate 106.

The IC assembly 500 may also include a package 104. The package 104 may include one or more dies or other components (not shown), and may be electrically coupled to the package substrate 106. In particular, conductive contacts 134 at a face of the package 104 may be electrically coupled to the conductive pillars 130 of the package substrate 106 by solder 132. In some embodiments, an underfill material 126 may be disposed around the solder 132 and between the die 102 and the package 104. The IC assembly 500 may thus be a "package-on-package" structure.

The dies 100 and 102, and the die(s) included in the package 104, of the IC assembly 500 may include any suitable circuitry. For example, in some embodiments, the die 100 may be an input/output controller hub, the die 102 may be a central processing unit, and the package 104 may include a memory, such as a dynamic random access memory (DRAM).

In some embodiments, a thermal management device (not shown) may be disposed around the IC assembly 500. In some embodiments, an overmold material (not shown) may be disposed around the IC assembly 500.

Although the IC assembly 500 illustrated in FIG. 3 is a flip chip package, other package architectures may be used. For example, the IC assembly 500 may be a ball grid array (BGA) package, such as an embedded wafer-level ball grid array (eWLB) package. In another example, the IC assembly 500 may be a wafer-level chip scale package (WLCSP) or a panel fanout (FO) package. An IC assembly 500 may include additional passive components, such as surface-mount resistors, capacitors, and inductors disposed on the first face 110 or the second face 112 of the package substrate 106. More generally, an IC assembly 500 may include any other active or passive components known in the art. The IC assembly 500 may include any suitable dies including any suitable devices. For example, the IC assembly 500 may include processing and/or communication circuitry for a mobile device. In another example, the IC assembly 500 may include processing and/or communication circuitry for a server.

Figure 4:
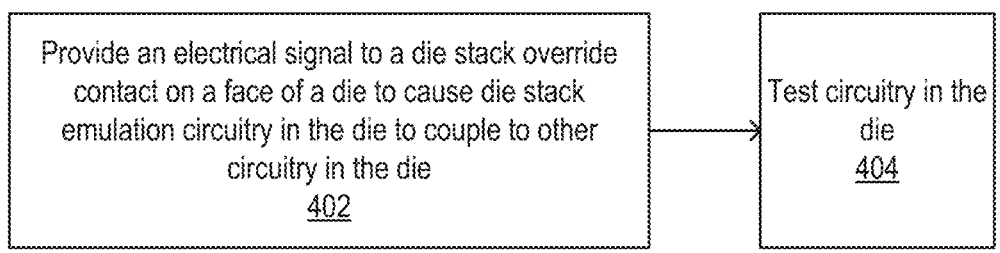
FIG. 4 is a flow diagram of a method of testing a die, in accordance with various embodiments.

FIG. 4 is a flow diagram of a method 400 of testing an IC die, in accordance with various embodiments. Although the operations of the method 400 may be illustrated with reference to particular embodiments of the dies 100 disclosed herein, the method 400 may be used to as part of a manufacturing and testing process of any suitable die. Operations are illustrated once each and in a particular order in FIG. 4, but the operations may be reordered and/or repeated as desired (e.g., with different operations performed in parallel when testing multiple electronic components simultaneously).

At 402, an electrical signal may be provided to a die stack override contact on a face of the die to cause die stack emulation circuitry 202 to couple to other circuitry in the die. For example, an electrical signal may be provided to a die stack override contact 410 at the first face 142 of a die 100 (e.g., by TE 160) to cause a die stack override switch 150 to select die stack emulation circuitry 202 in the die 100, electrically coupling the die stack emulation circuitry 202 and the other circuitry 404 (and "disconnecting" the other circuitry 204 from some or all of the conductive contacts 186 at the second face 144 of the die 100).

At 604, the die may be tested. For example, the other circuitry 204 may be tested in accordance with a test program executed by the die stack emulation circuitry 202.

Although various ones of the embodiments disclosed herein discuss a die stack override switch 150 whose state may be changed by providing appropriate electrical signals to a die stack override contact 410 on the face of the die 100, any of the embodiments disclosed herein may not include a die stack override contact 410. Instead, some embodiments may include a test data register in a memory of the die 100 whose values may be programmed externally (e.g., by TE 160 through the conductive contacts 124) as part of the testing process; when the test data register is being accessed, this access may cause the die stack override switch 150 to select the die stack emulation circuitry 202. In some embodiments, the test data register may be accessed during an external reset or strap (e.g., triggered by the de-assertion of an external reset pin of the die 100).

The die stack override switches 150 and related arrangements disclosed herein may be included in any suitable electronic structure. FIGS. 5-8 illustrate various examples of IC structures that may include any of the die stack override switches 150, die stack emulation circuitry 202, or related arrangements disclosed herein.

Figure 5:
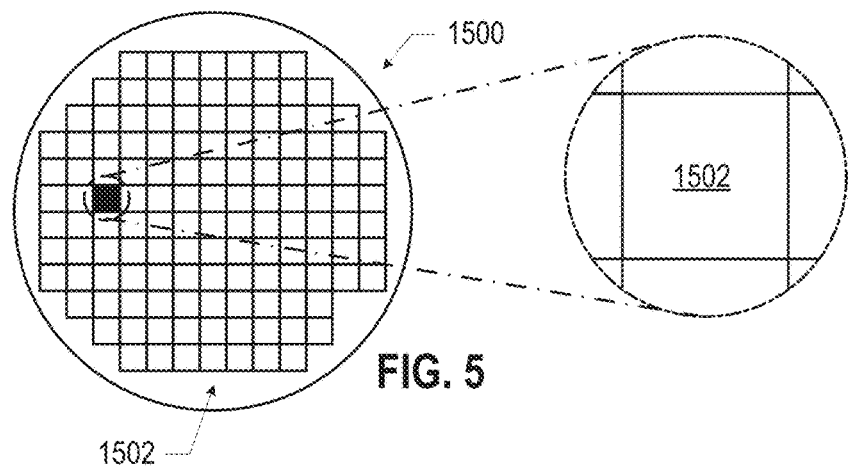
FIG. 5 is a top view of a wafer and dies that may include a die stack override switch, in accordance with any of the embodiments disclosed herein.

FIG. 5 is a top view of a wafer 1500 and dies 1502 that may include one or more die stack override switches 150, die stack emulation circuitry 202, or related arrangements, in accordance with any of the embodiments disclosed herein. For example, the dies 1502 may be the dies 100 or 102, or the die included in the package 104, discussed above. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more die stack override switches 150, die stack emulation circuitry 202, or related arrangements, one or more transistors (e.g., some of the transistors 1640 of FIG. 6, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 8) or other logic that is configured to store information in the memory devices or execute instructions stored in the memory array.

Figure 6:
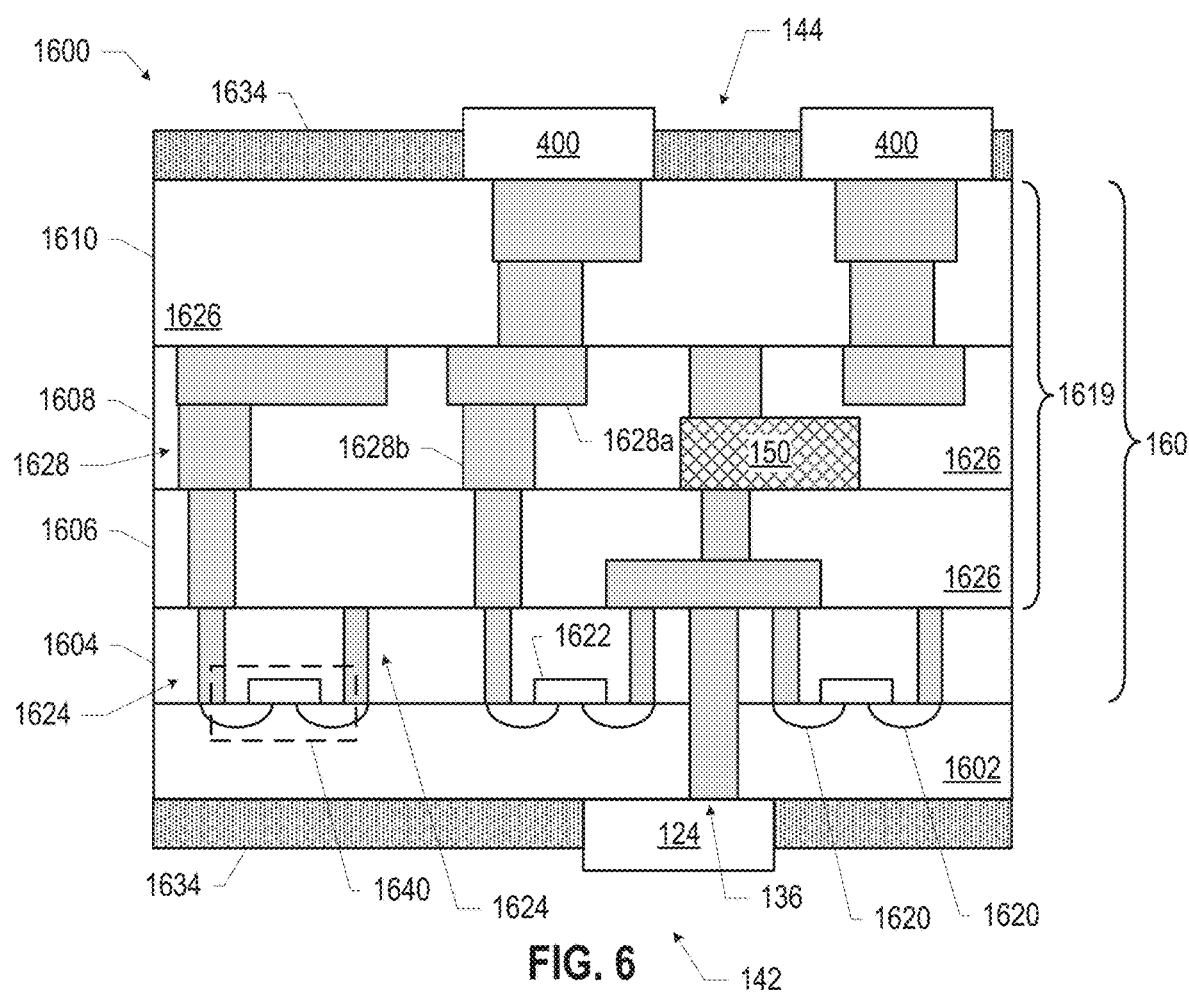
FIG. 6 is a side, cross-sectional view of an IC device that may include a die stack override switch, in accordance with any of the embodiments disclosed herein.

FIG. 6 is a side, cross-sectional view of an IC device 1600 that may include one or more die stack override switches 150, die stack emulation circuitry 202, or related arrangements, in accordance with any of the embodiments disclosed herein. One or more of the IC devices 1600 may be included in one or more dies 1502 (FIG. 5). The IC device 1600 may be formed on a substrate 1602 (e.g., the wafer 1500 of FIG. 5) and may be included in a die (e.g., the die 1502 of FIG. 5). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 5) or a wafer (e.g., the wafer 1500 of FIG. 5). As shown in FIG. 6, through-silicon vias 136 may extend through the substrate 1602, and may contact the metallization stack 1619 at any suitable interconnect layer (discussed below). In some embodiments, conductive contacts 124 may be disposed at the first face 142 of the IC device 1600, and may be electrically coupled to the through-silicon vias 136. Although the term "through-silicon via" may be used to refer to conductive pathways through the substrate 1602, this is simply a term of art, and the substrate 1602 may be formed of materials other than silicon.

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 6 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

In some embodiments, one or more die stack override switches 150 or die stack emulation circuitry 202 may be disposed in one or more of the interconnect layers 1606-1610, in accordance with any of the techniques disclosed herein. FIG. 6 illustrates a single die stack override switch 150 in the interconnect layer 1608 for illustration purposes, but any number and structure of die stack override switches 150 may be included in any one or more of the layers in a metallization stack 1619. In some embodiments, one or more die stack override switches 150 may be disposed in the substrate 1602 (e.g., along with one or more through-silicon vias 136), instead of or in addition to the metallization stack 1619. More generally, the circuit components that may be included in a die stack override switch 150 may be distributed anywhere in the IC device 1600. One or more die stack override switches 150 may be coupled to any suitable ones of the devices in the device layer 1604, and/or to one or more of the conductive contacts 186 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 6). Although a particular number of interconnect layers 1606-1610 is depicted in FIG. 6, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 6. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 6. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604. In some embodiments, the first interconnect layer 1606 may be part of the routing metal 140 (FIG. 5). More generally, the routing metal 140 may include one or more interconnect layers at the "bottom" of the metallization stack 1619.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker. In some embodiments, the third interconnect layer 1610 may be part of the top metal 138 (FIG. 5). More generally, the top metal 138 may include one or more interconnect layers at the "top" of the metallization stack 1619.

The IC device 1600 may include a solder resist material 1634 (e.g., polyimide or similar material) and one or more conductive contacts 186 formed on the interconnect layers 1606-1610 at the second face 144. In FIG. 6, the conductive contacts 186 (and the conductive contacts 124) are illustrated as taking the form of bond pads. The conductive contacts 186 and the conductive contacts 124 may be electrically coupled with the interconnect structures 1628 and configured to route the electrical signals of the transistor(s) 1640 and/or other components included in the IC device 1600 to other external devices. For example, solder bonds may be formed on the one or more conductive contacts 186 and 124 to mechanically and/or electrically couple a chip including the IC device 1600 with other components (e.g., a die or another circuit board). The IC device 1600 may include additional or alternate structures to route the electrical signals from the interconnect layers 1606-1610; for example, the conductive contacts 186 and 124 may include other analogous features (e.g., posts) that route the electrical signals to external components.

Figure 7:
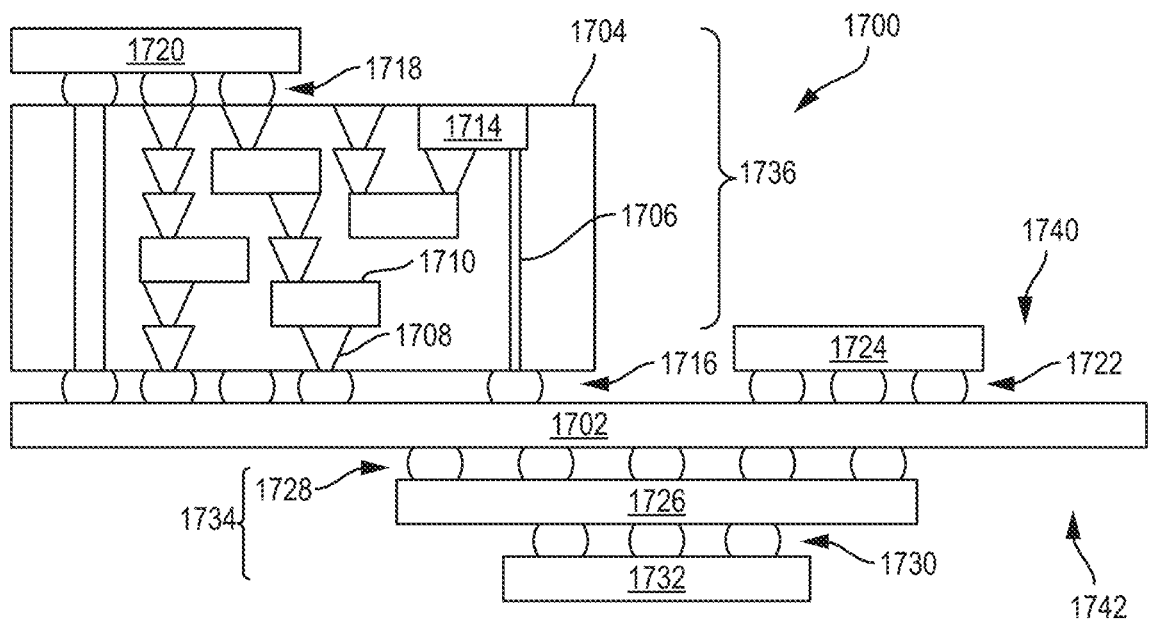
FIG. 7 is a side, cross-sectional view of an IC device assembly that may include a die stack override switch, in accordance with any of the embodiments disclosed herein.

FIG. 7 is a side, cross-sectional view of an IC device assembly 1700 that may include one or more IC packages or other electronic components (e.g., a die) including one or more die stack override switches 150, die stack emulation circuitry 202, or related arrangements, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC assembly 500 discussed above with reference to FIG. 1 (e.g., may include one or more die stack override switches 150 or die stack emulation circuitry 202 in a die 100).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 7 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 7), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 7, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 5), an IC device (e.g., the IC device 1600 of FIG. 6), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 7, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 7 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 8:
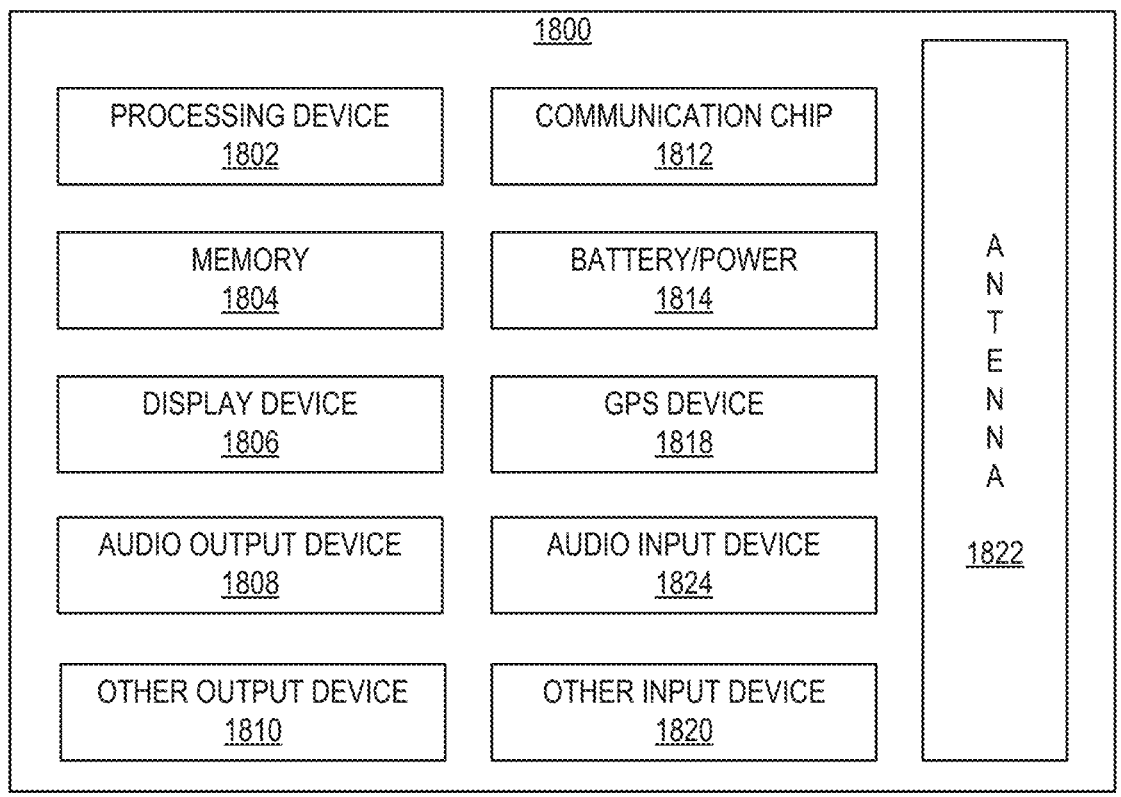
FIG. 8 is a block diagram of an example electrical device that may include a die stack override switch, in accordance with any of the embodiments disclosed herein.

FIG. 8 is a block diagram of an example electrical device 1800 that may include one or more die stack override switches 150 or die stack emulation circuitry 202, in accordance with any of the embodiments disclosed herein. For example, any suitable ones of the components of the electrical device 1800 may include one or more of the IC assemblies 500, IC devices 1600, or dies 100 or 1502 disclosed herein. A number of components are illustrated in FIG. 8 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 8, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded DRAM (eDRAM) or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a die, including first conductive contacts at a first face of the die, second conductive contacts at a second face of the die, wherein the second face is opposite to the first face, die stack emulation circuitry, other circuitry, and a switch coupled to the second conductive contacts, the die stack emulation circuitry, and the other circuitry, wherein the switch is to couple the second conductive contacts to the other circuitry when the switch is in a first state, and the switch is to couple the die stack emulation circuitry to the other circuitry when the switch is in a second state different from the first state.

Example 2 may include the subject matter of Example 1, and may further specify that the first conductive contacts include a die stack override contact to which electrical signals may be applied to change a state of the switch.

Example 3 may include the subject matter of Example 2, and may further specify that the switch is one of a plurality of switches, and electrical signals may be applied to the die stack override contact to change states of the plurality of switches.

Example 4 may include the subject matter of Example 3, and may further specify that the die stack override contact is a single die stack override contact.

Example 5 may include the subject matter of any of Examples 1-4, and may further specify that the die is an input/output controller hub.

Example 6 may include the subject matter of any of Examples 1-5, and may further specify that the die stack emulation circuitry is to perform a test program to test the other circuitry.

Example 7 may include the subject matter of Example 6, and may further specify that the die stack emulation circuitry is to receive at least a portion of the test program from a test access port of the die.

Example 8 may include the subject matter of Example 6, and may further specify that the die includes input/output circuitry and a memory, and the test program includes a data transfer between the input/output circuitry and the memory.

Example 9 may include the subject matter of any of Examples 1-8, and may further specify that the die is a first die and the IC structure further includes: a second die including conductive contacts at a first face of the second die; wherein the conductive contacts at the first face of the second die are electrically coupled to the second conductive contacts at the second face of the first die.

Example 10 may include the subject matter of Example 9, and may further specify that the second die is a dummy die.

Example 11 may include the subject matter of Example 9, and may further specify that the second die is a processing device.

Example 12 may include the subject matter of any of Examples 9-11, and may further include: a package substrate, including first conductive contacts at a first face of the package substrate, and second conductive contacts at a second face of the package substrate, wherein the second face of the package substrate is opposite to the first face of the package substrate; wherein at least some of the second conductive contacts at the second face of the package substrate are electrically coupled to the first conductive contacts at the first face of the die.

Example 13 may include the subject matter of Example 12, and may further include: a third die including conductive contacts at a first face of the third die; wherein the conductive contacts at the first face of the third die are electrically coupled to some of the second conductive contacts at the second face of the package substrate.

Example 14 may include the subject matter of Example 13, and may further specify that the some of the second conductive contacts at the second face of the package substrate include conductive pillars.

Example 15 may include the subject matter of Example 13, and may further specify that the second die is between the first die and the third die.

Example 16 may include the subject matter of any of Examples 13-15, and may further specify that the third die is a memory device.

Example 17 is a method of testing an integrated circuit (IC) structure, including: providing an electrical signal to a die stack override contact on a die to change a state of a switch in the die to couple die stack emulation circuitry in the die to other circuitry in the die; and causing the die stack emulation circuitry to perform a test program to test the other circuitry; wherein the die stack emulation circuitry is to emulate a presence of another die coupled to the die.

Example 18 may include the subject matter of Example 17, and may further specify that the die includes a first face and an opposing second face, the die stack override contact is on the first face, and the die stack emulation circuitry is to emulate a presence of another die coupled to the second face of the die.

Example 19 may include the subject matter of Example 17, and may further specify that causing the die stack emulation circuitry to perform a test program includes providing an electrical signal to a reset pin of the die.

Example 20 may include the subject matter of any of Examples 17-19, and may further include: coupling the die to a package substrate; wherein the die stack override contact is electrically coupled to a conductive contact on the package substrate.

Example 21 may include the subject matter of any of Examples 17-20, and may further include: coupling a dummy die to the die, wherein the dummy die does not generate any signals during testing.

Example 22 may include the subject matter of any of Examples 17-21, and may further specify that the die stack emulation circuitry includes a processing unit and a memory.

Example 23 may include the subject matter of Example 22, and may further specify that the memory is a static random access memory.

Example 24 is an integrated circuit (IC) assembly, including: a package substrate; a first die, including first conductive contacts at a first face of the first die, and second conductive contacts at a second face of the first die, wherein the first conductive contacts of the first die are electrically coupled to conductive contacts of the package substrate, the second face of the first die is opposite to the first face of the first die, and the first conductive contacts include a die stack override contact; and a second die, including conductive contacts at a face of the second die, wherein the conductive contacts of the second die are electrically coupled to the second conductive contacts of the first die; wherein, during operation of the first die, provision of a first electrical signal to the die stack override contact is to cause circuitry of the first die to operate without input from the second die, and provision of a second electrical signal to the die stack override contact is to cause circuitry of the first die to operate based on input from the second die.

Example 25 may include the subject matter of Example 24, and may further specify that the die stack override contact is coupled to a die stack override switch, and the die stack override switch is to selectively couple die stack emulation circuitry in the first die to other circuitry of the first die.

Example 26 may include the subject matter of any of Examples 24-25, and may further include: a third die coupled to the package substrate, wherein the second die is between the first die and the third die.

Example 27 may include the subject matter of any of Examples 24-26, and may further specify that the first die is an input/output controller, the second die is a central processing unit, and the third die is a memory.

Example 28 is test equipment, including: a plurality of conductive contacts, wherein one of the conductive contacts is to electrically couple to a die stack override contact in a first die of a test assembly when the test assembly is coupled to the test equipment, wherein the test assembly includes a second die coupled to the first die; and circuitry to provide an electrical signal to the one of the conductive contacts to cause circuitry of the first die to operate without input from the second die.

Example 29 may include the subject matter of Example 28, and may further specify that the plurality of conductive contacts is to electrically couple to conductive contacts of a package substrate in the test assembly.

Example 30 may include the subject matter of any of Examples 28-29, and may further specify that the test equipment includes automated test equipment.

Example 31 may include the subject matter of any of Examples 28-29, and may further specify that the test equipment includes a system board.

The invention claimed is:

1. An integrated circuit (IC) structure, comprising:
   a first die, including:
     first conductive contacts at a first face of the first die;
     second conductive contacts at a second face of the first die, wherein the second face is opposite to the first face;
     die stack emulation circuitry;
     other circuitry; and
     a switch coupled to the second conductive contacts, the die stack emulation circuitry, and the other circuitry, wherein:
       the die stack emulation circuitry is configured to emulate signals from another die,
       the switch is to couple the second conductive contacts to the other circuitry when the switch is in a first state, and
       the switch is to couple the die stack emulation circuitry to the other circuitry when the switch is in a second state different from the first state; and
   a second die coupled to the second conductive contacts, wherein:
     the second die includes metal layers without any active circuitry, and
     the second die emulates a physical presence of the another die without electrical functionalities of the another die.

2. The IC structure of claim 1, wherein the first conductive contacts include a die stack override contact to which electrical signals may be applied to change a state of the switch.

3. The IC structure of claim 2, wherein the switch is one of a plurality of switches, and electrical signals may be applied to the die stack override contact to change states of the plurality of switches.

4. The IC structure of claim 3, wherein the die stack override contact is a single die stack override contact.

5. The IC structure of claim 1, wherein the first die is an input/output controller hub.

6. The IC structure of claim 1, wherein the die stack emulation circuitry is to perform a test program to test the other circuitry.

7. The IC structure of claim 6, wherein the die stack emulation circuitry is to receive at least a portion of the test program from a test access port of the first die.

8. The IC structure of claim 6, wherein the first die includes input/output circuitry and a memory, and the test program includes a data transfer between the input/output circuitry and the memory.

9. The IC structure of claim 1, wherein the second die is a dummy die.

10. The IC structure of claim 1, further comprising:
   a package substrate, including:
     first conductive contacts at a first face of the package substrate, and
     second conductive contacts at a second face of the package substrate, wherein the second face of the package substrate is opposite to the first face of the package substrate,
     wherein at least some of the second conductive contacts at the second face of the package substrate are electrically coupled to the first conductive contacts at the first face of the first die.

11. The IC structure of claim 10, further comprising:
a third die including conductive contacts at a first face of the third die,
wherein the conductive contacts at the first face of the third die are electrically coupled to some of the second conductive contacts at the second face of the package substrate.

12. The IC structure of claim 11, wherein the third die is a memory device.

13. The IC structure of claim 1, wherein the die stack emulation circuitry comprises a microcontroller and static random access memory (SRAM) configured to provide clock and reset signals that emulate corresponding signals from the another die.

14. A method of testing an integrated circuit (IC) structure, comprising:
providing an electrical signal to a die stack override contact on a first die to change a state of a switch in the first die to couple a die stack emulation circuitry in the first die to other circuitry in the first die;
coupling a second die to the first die, wherein the second die comprises conductive pathways without any active circuitry, and the second die emulates a physical presence of another die without electrical functionalities of the another die; and
causing the die stack emulation circuitry to perform a test program to test the other circuitry, wherein the die stack emulation circuitry is to emulate the electrical functionalities of the another die.

15. The method of claim 14, wherein the first die includes a first face and an opposing second face, the die stack override contact is on the first face, and the another die is to be coupled to the second face of the die.

16. The method of claim 14, wherein causing the die stack emulation circuitry to perform a test program includes providing an electrical signal to a reset pin of the first die.

17. The method of claim 14, wherein:
the second die is a dummy die, and
the dummy die does not generate any signals during testing.

18. An integrated circuit (IC) assembly, comprising:
a package substrate;
a first die, including:
first conductive contacts at a first face of the first die;
a die stack emulation circuitry configured to emulate electrical signals from a second die;
other circuitry that is different from the die stack emulation circuitry; and
second conductive contacts at a second face of the first die,
wherein:
the first conductive contacts of the first die are electrically coupled to conductive contacts of the package substrate, the second face of the first die is opposite to the first face of the first die, and the first conductive contacts include a die stack override contact coupled to a die stack override switch; and
the second die, including: conductive contacts at a face of the second die, wherein the conductive contacts of the second die are electrically coupled to the second conductive contacts of the first die,
wherein during operation of the first die:
provision of a first electrical signal to the die stack override contact is to cause the die stack override switch to selectively couple the die stack emulation circuitry in the first die to the other circuitry in the first die, such that the other circuitry in the first die is to operate with input from the die stack emulation circuitry in the first die instead of input from the second die, and
provision of a second electrical signal to the die stack override contact is to cause the die stack override switch to selectively decouple the die stack emulation circuitry in the first die from the other circuitry in the first die, such that the other circuitry in the first die is to operate based on input from the second die.

19. The IC assembly of claim 18, further comprising:
a third die coupled to the package substrate, wherein the second die is between the first die and the third die.

20. The IC assembly of claim 18, wherein the first die is an input/output controller, the second die is a central processing unit, and the third die is a memory.

21. Test equipment, comprising:
a plurality of conductive contacts, wherein one of the conductive contacts is to electrically couple to a die stack override contact in a first die of a test assembly when the test assembly is coupled to the test equipment, wherein the test assembly includes a second die coupled to the first die; and
circuitry to provide an electrical signal to the one of the conductive contacts to cause circuitry of the first die to operate without input from the second die,
wherein:
the first die comprises a die emulation circuitry configured to emulate electrical signals of the second die, the die emulation circuitry being different from the circuitry,
the electrical signal to the one of the conductive contacts is to cause the circuitry of the first die to operate with input from the die emulation circuitry instead of the second die.

22. The test equipment of claim 21, wherein the plurality of conductive contacts is to electrically couple to conductive contacts of a package substrate in the test assembly.

23. The test equipment of claim 21, wherein the test equipment includes automated test equipment or a system board.

\* \* \* \* \*